United States Patent [19]

Weitze et al.

[11] 3,922,777

[45] Dec. 2, 1975

[54] PROCESS FOR THE PRODUCTION OF LAYER CIRCUITS WITH CONDUCTIVE LAYERS ON BOTH SIDES OF A CERAMIC SUBSTRATE

[75] Inventors: Artur Weitze, Pullach; Peter Leskovar, Munich, both of Germany

[73] Assignee: Siemens Aktiengesellschaft, Berlin & Munich, Germany

[22] Filed: Feb. 1, 1974

[21] Appl. No.: 438,865

[30] Foreign Application Priority Data

Feb. 8, 1973 Germany........................... 2306236

[52] U.S. Cl. ................... 29/628; 29/625; 174/68.5; 264/61; 317/101 CC

[51] Int. Cl.²........................................... H01R 43/00

[58] Field of Search...................... 29/624, 625, 628; 174/68.5; 317/261, 101 CC; 156/62.2, 86, 89; 264/58, 60, 61, 63, 67

[56] References Cited

UNITED STATES PATENTS

| | | | |
|---|---|---|---|
| 3,488,429 | 1/1970 | Boucher | 29/625 X |
| 3,517,437 | 6/1970 | Szobonya | 29/625 X |
| 3,540,894 | 11/1970 | McIntosh | 264/61 X |
| 3,561,110 | 2/1971 | Feulner et al. | 264/61 UX |
| 3,772,748 | 11/1973 | Rutt | 29/625 X |
| 3,798,762 | 3/1974 | Harris et al. | 29/626 |

FOREIGN PATENTS OR APPLICATIONS

| | | | |
|---|---|---|---|
| 856,584 | 12/1960 | United Kingdom | 174/68.5 |

OTHER PUBLICATIONS

McIntosh, "Multilayer Ceramic Sandwiches," IBM Tech. Discl. Bull., Vol. 16, No. 1, June 1973, p. 43.

*Primary Examiner*—Milton S. Mehr
*Assistant Examiner*—Joseph A. Walkowski
*Attorney, Agent, or Firm*—Hill, Gross, Simpson, Van Santen, Steadman, Chiara & Simpson

[57] ABSTRACT

Process for the production of layer-type printed circuits having conductive layers on both sides of a ceramic substrate in which an aperture is provided in a green (unfired) ceramic substrate, a high melting point pin is inserted into the aperture and thereafter the green substrate is sintered to bond the pin in place and provide for electrical connection between the two layers. A multi-layer composite can be made up by stacking a plurality of such substrates together with pins being provided to lock the substrates together and the entire multi-layer body is then sintered.

5 Claims, 2 Drawing Figures

PROCESS FOR THE PRODUCTION OF LAYER CIRCUITS WITH CONDUCTIVE LAYERS ON BOTH SIDES OF A CERAMIC SUBSTRATE

BACKGROUND OF THE INVENTION

1. Field of the Invention

This invention is in the field of printed circuits and is directed specifically to an improved process for providing through pins between the conductive layers.

DESCRIPTION OF THE PRIOR ART

Printed circuits of the layer type which are provided with through contacts are being produced in accordance with various processes. In the thick layer technique, a thick paste containing metal particles dispersed therethrough is inserted into the holes in the ceramic body, or the walls of the holes are wetted with a highly fluid metal dispersion which, after the sintering process, provides a conductive connection between the layers on opposite sides of the ceramic substrate. In the thin film technique, the holes are exposed to vapor deposition of metal in such a manner that a conductive film is deposited in the walls of the holes. Other constructions produce a conductive connection between the layers by means of contacts at the edge of the substrate, or metal pins which are soldered into the holes to produce the electrical connection. In accordance with German Laid Open application Ser. No. 1,590,345, copper pins are employed which are coated with a hard soldering agent. A short surge of current is delivered to the coated copper pins to heat the same to a temperature at which the hard soldering agent melts without effecting the conductive layers. A common feature of these processes is that the substrates are sintered before the through contacts are produced.

German Laid Open application Ser. No. 1,301,378 describes a process for producing a ceramic block having metal lined capillary tubes. Green ceramic laminae are pierced to provide the desired geometry for the capillary system. The perforations and the surfaces of the laminae are coated with a metallic paste containing a volatilizable additive. Then, the laminae are stacked to form a block and heated in order to expel the additives. After this, the laminae are sintered. The capillaries which are lined with metal in this manner can also be filled with molten metals which produce highly conductive electrical connections. To accomplish this, the block is submerged into a copper or aluminum bath under substantially reduced pressure conditions. In the case of a copper bath, a dry hydrogen atmosphere is used.

The principal object of the present invention is to provide layer type printed circuits with contacts of high conductivity and high mechanical strength, and to produce the same in a relatively simple process.

SUMMARY OF THE INVENTION

In accordance with the present invention, we utilize pins consisting of metals having high melting points, said pins being inserted into appropriate holes provided in a still green (unfired) ceramic substrate. These high melting point metals can be noble metals of the platinum group, particularly platinum or palladium, or they may be refractory metals such as molybdenum or tungsten. Since the through contacts consist of solid material, they provide a much greater degree of conductivity than processes employing the deposition of thin films of metal on a wall aperture.

The pins may consist of drawn wires such as platinum wires, and they can also be formed of powdered metal compacts. The diameter and the length of the pins must in each case provide for the shrinkage of the substrate which occurs during sintering. It is advantageous also to add silicates to the material of the pins or to encase the pins with such silicates. During the sintering of the ceramic, solid phase reactions take place in the presence of the silicates which secure the metal more firmly to the substrate than by the shrinkage of the substrate during sintering alone in the ceramic material. The through contacts produced in this way are vacuum tight.

Following the sintering process, the pins are contacted in accordance with the known processes for producing conductive films by the thick or thin film techniques. For thick layer circuits, it is advantageous to apply the conductor path pastes to the still green substrate after the insertion of the pins and prior to the sintering of the ceramic. By means of this technique, it is also possible to produce multi-layer circuits. The substrates are perforated while still green, and provided with contacting pins and printed with conductor paths. A plurality of substrates are then stacked up and compressed under pressure and heat. In a subsequent sintering process, at temperatures of between 1450°C and 1800°C, the substrate, the through contacts and the conductor paths are then sintered to form a sealed, ceramic body.

Not all ceramic substrates with through contacts and conductor paths can be readily metallized in an oxidizing frame. Refractory metals require a reducing atmosphere during the burning process, while most thick film materials require an oxidizing atmosphere. Accordingly, the pins consisting of the above-mentioned refractory metals can be overlaid with appropriate pastes such as tungsten pins provided with tungsten pastes, both requiring a reducing atmosphere. The pins consisting of noble metals of the platinum group permit the burning process to be carried out in an oxidizing atmosphere.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

Figure 1:
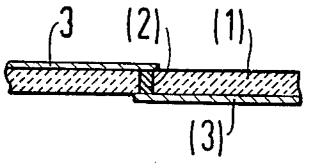
FIG. 1 is a cross-sectional view of an embodiment of the present invention.

FIG. 1 illustrates a ceramic substrate 1 provided with a suitable aperture through which a contacting pin 2 extends to bridge conductor paths 3 located on opposite sides of the ceramic substrate 1. The aperture is provided in the substrate while the ceramic substrate is still in its green condition. These pins can consist of noble metals of the platinum group or refractory metals such as molybdenum or tungsten. The ceramic body with the pins located therein is then subjected to sintering procedures appropriate to the ceramic being used causing the ceramic to shrink about the pins and provide a tight bond therewith. After the sintering process, the conductive layers 3 are applied by the thick or thin film technique for the application of conductive paths on ceramic substrates.

Figure 2:
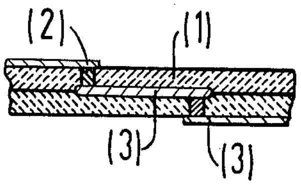
FIG. 2 is a view similar to FIG. 1 but showing a multilayer construction.

The structure in FIG. 2 is similar to that shown in FIG. 1 except that it shows a plurality of substrates 1 being bonded together with the pins 3 interconnecting the conductive layers of the multi-layer construction.

As examples of suitable pin compositions according to the present invention, the following may be mentioned. One may use a high melting metal compact produced by powder metallurgy and to which 2–18 weight percent manganese silicate was added to the metal powder. Alternatively, a pulverized lead borosilicate glass may be added in the same amount. The pins may, as a further example, consist of a drawn platinum wire coated with a 5–25 micron layer of lead borosilicate glass.

It should be evident that various modifications can be made to the described embodiments without departing from the scope of the present invention.

We claim as our invention:

1. A process for the production of layer-type printed circuits having conductive layers on both sides of a ceramic substrate which comprises providing an aperture in a green ceramic substrate, inserting into said aperture, a high melting metal pin having incorporated therewith metal silicate, and thereafter sintering the green substrate under conditions to produce a solid state reaction between the ceramic and the silicate, the dimensions of said pin being such that the ends of said pin, upon shrinkage of said green substrate due to sintering, are flush with said sides.

2. The process in accordance with claim 1 in which the high melting metal pin is produced by powdered metallurgy and the metal silicate is incorporated therein by adding it to the metal powder.

3. The method in accordance with claim 2 in which the metal silicate is selected from the group consisting of manganese silicate and lead borosilicate.

4. The process in accordance with claim 1 in which the metal silicate is incorporated in the metal pin by coating the pin with a layer of the metal silicate glass.

5. The method in accordance with claim 4 in which the metal silicate is lead borosilicate.

* * * * *